United States Patent [19]

Sullivan et al.

[11] Patent Number: 4,774,270

[45] Date of Patent: Sep. 27, 1988

[54] COATING FOR EMI SHIELDING

[75] Inventors: F. R. Sullivan, Cleveland Heights; David M. Aleska, Parma, both of Ohio

[73] Assignee: The B. F. Goodrich Company, Akron, Ohio

[21] Appl. No.: 63,960

[22] Filed: Jun. 19, 1987

Related U.S. Application Data

[62] Division of Ser. No. 821,310, Jan. 22, 1986, Pat. No. 4,715,989.

[51] Int. Cl.$^4$ .......................... C08K 3/00; H01B 1/06; C08J 5/09
[52] U.S. Cl. ..................................... 523/334; 523/335; 524/401; 524/439; 524/435; 524/440; 524/414; 252/502; 252/506; 252/512; 252/513; 252/518; 252/519
[58] Field of Search .............. 252/511, 512, 513, 514, 252/519, 518, 502, 506, 510; 523/137, 201, 202, 220, 200, 215, 216, 334, 335; 524/401, 439, 440, 414; 82/1, 310; 210/650, 733, 654, 738, 702, 724, 726, 732; 106/1.18, 1.19, 290, 308 Q, 308 M

[56] References Cited

U.S. PATENT DOCUMENTS

| | | | |
|---|---|---|---|
| 4,159,364 | 6/1979 | Craig | 428/334 |
| 4,209,429 | 6/1980 | Lin et al. | 252/510 |
| 4,474,685 | 10/1984 | Annis | 252/511 |
| 4,493,912 | 1/1985 | Dudgeon et al. | 523/137 |
| 4,518,524 | 5/1985 | Stoetzes | 252/514 |
| 4,566,990 | 1/1986 | Lin et al. | 252/514 |
| 4,569,786 | 2/1986 | Deguchi | 252/512 |

*Primary Examiner*—Josephine Barr
*Attorney, Agent, or Firm*—Woodrow W. Ban

[57] ABSTRACT

An aqueous based electrically conductive paint having substantially enhanced settling properties employing a nickel flake pigment and a surfactant having substantial unsaturation characteristics. Paint finds particular application in providing EMI and RFI shielding for electrical components when applied to cabinetry housing such components.

11 Claims, No Drawings

COATING FOR EMI SHIELDING

This is a division, of application Ser. No. 06/821,310, filed 1/22/86, now U.S. Pat. No. 4,715,989.

FIELD OF THE INVENTION

This invention relates to paint coatings, and more particularly to paint coatings containing conductive particles such as metal particles. More specifically this invention relates to nickel containing water based paint for providing EMI shielding to enclosures for electronic components.

BACKGROUND OF THE INVENTION

It has been long known that paint coatings could be made electrically conductive by the inclusion therein of particulates comprised of matter having substantial electrical conductivity properties. A number of paints are known incorporating electrically conductive metal particles or particles of carbon therein which can function to conduct, for example static electricity, accruing in a structure which the paint is protecting.

More recently, with the advent of elaborate solid state circuitry devices the requirements for performance characteristics of conductive coatings have become more stringent. These solid state devices include electronic memories susceptible to so-called EMI (electromagnetic wave interference) or RFI (radio frequency interference). EMI and RFI have demonstrated a capability for de-programming memories and the potential for ruining circuitry thus rendering complicated electronic circuitry devices useless. In the past, EMI or RFI sensitivity was not of particular concern to the electronics industry as electronics devices typically were housed in metallic housings which functioned also to shield electronic devices from EMI or RFI interference.

More recently, plastics have found increasing use in forming cabinetry for containing electronic components and, typically, such plastics are sufficiently electrically non-conductive whereby, unlike metal housings, no significant shielding from RFI or EMI electromagnetic radiation is achieved.

Electrically conductive paints have therefore achieved some acceptance in imparting electromagnetic radiation protection to electronic circuitry contained in plastic cabinetry. Such conductive paint coatings are typically applied to interior surfaces of cabinetry encapsulating electronic components and then are grounded in suitable or conventional fashion to dispose properly of electrical energy generated by impinging electromagnetic radiation.

Such paint coatings configured for protecting electronic devices from EMI and RFI electromagnetic radiation must provide substantial conductivity to be effective. While various entities within the electronics industry have varying standards for measuring the conductivity performance for such coatings, it would appear that a generally universal performance standard for EMI/RFI cabinetry protection of about 1 $\Omega$/square after aging would appear to be emerging.

It is known to formulate coatings including electrically conductive additives such as carbon or metals in particulate form where the coatings have a solvent base. More recently, coatings have been formulated having a water base and including electrically conductive particulates of, for example, carbon or metal particles.

A number of factors influence the acceptability of a particular coating for use on a paint spraying line such as may be associated with the manufacture of electronics components cabinetry having an applied EMI/RFI paint coating upon inner surfaces of the cabinetry. Desirably, such coatings: (i) should be air dryable rather than requiring oven drying; (ii) should be substantially free from a tendency for rapid settling of any included particulates so that constant or frequent agitation of the coating during application on the spraying line is not necessary and so that upon shutdown of a spray line for an extended period such as over a weekend, settling in spray hoses, nozzles and paint containers will not cause serious spray line difficulties; (iii) should have good properties of adhesion to the plastic cabinetry; (iv) should have outstanding storage stability especially with reference to settling of particulate therein; and in addition (v) should be substantially resistant to the effects of abrasion, humidity, and temperature cycling.

Particularly, solvent based conductive paints traditionally have included a significant quantity of entrained solvents which evaporate upon pain drying. The size and cost of physical equipment necessary to cope adequately with recovery of such solvents on a commercial scale, for reasons such as the prevention of air pollution or solvent reuse, can detract significantly from the desirability of using solvent based paint coatings in effecting EMI/RFI protection for electronics hardware cabinetry.

Water based coatings, often also known as latex paints, tend to evolve relatively small quantities of solvent upon drying but are more prone to difficulties with: (i) adhesion, particularly to the surfaces of certain plastics such as NORYL®, or LEXAN® (General Electric Co.), CALIBRE® or STYRON® (Dow), CYCOLAC® (Borg Warner), or GEON® (BFGoodrich); ii) settling problems while in use on a spray line; and (iii) a final conductivity of the coating being undesirably greater than the preferred maximum of 1 $\Omega$/square. Particularly, those water based paints employing metal flakes and most particularly nickel flake particles as the conductive particulate within the paint coating have tended to demonstrate undesirable settling characteristics and, to a considerable extent, substantially undesirable electrical conductance properties.

A water based, electrically conductive, air drying water based paint having settling characteristics suitable for use in spray lines wherein shutdowns of 72 hours or more may be tolerated without detrimental effect upon the spray equipment would have substantial application in the electronics industry particularly where the coating resulting from application of such a paint to a plastic electronics cabinet component is a coating having an electrical conductance parameter of 1 $\Omega$/square or less.

SUMMARY OF THE INVENTION

The present invention provides an electrically conductive, water based, air dried paint including a metal (metallic) flake material. By metal what is meant is an elemental metal, alloys of elemental metals, compounds including an elemental metal such as metal phosphides, substrates coated with a elemental metal, elemental mental alloy or such compounds, and mixtures thereof. The metal typically is gold, silver, copper, metal phosphides and the like or, preferably nickel, or may be mixtures of these or substrates coated with the metals, and the flakes typically are possessed of a thickness of not more than about 3 microns and a long dimension of at least about 10 microns but not greater than a dimension passable through the spray nozzle intended for applying the paint.

The paint of the instant invention includes a copolymeric latex, and preferably a partially cross linked copolymeric latex, with the copolymer having a backbone, and pendant acidic functional moieties therefrom in sufficient quantity to provide the copolymer with an acid number of at least about 7 but not more than about 195. The latex, typically comprising copolymeric solids suspended in a water based serum, is present in the paint in a ratio of about 15% by weight (polymer basis) to about 100% of the weight of the nickel present in the paint.

The paint includes an air drying, preferably water soluble, co-solvent desirably having a boiling point greater than water and capable of coalescing particles of the latex to form a coherent coating upon the surface being painted. The co-solvent is present in the paint in a quantity of at least about 2% and preferably not more than 20% by weight of the copolymer in the latex. But these percentages may need to be more elevated where the paint is substantially diluted by water before application to a substrate The paint includes a pH adjusting compound in a quantity sufficient to adjust the pH of the paint to between about 5 and 11. A film forming enhancer such as a defoamer or a salt of at least one fatty acid is included in the paint. The salt preferably includes an unsaturated component so that the salt is possessed of an iodine value of at least about 85 but not more than about 250. The salt is present in the paint in a quantity of between about 1% by weight and about 5% by weight of the metallic flake present in the paint. This film forming enhancer should be essentially free of silicones and silicates.

The paint of the invention optionally may be made harder when dried upon a substrate by the inclusion of carbon and/or silica (colloidal) in a quantity of not more than about 10% by weight and preferably not more than about 5% by weight of the weight of nickel contained in the paint. Where during processing, manipulation of a particular latex under agitation to produce a blended paint product produces a foaming condition, an anti-foaming agent may be included in the paint in a quantity not exceeding about 1% by weight of the metal flake in the paint whether or not a defoaming material is also employed as a film forming enhancer.

It is preferred in the practice of a invention that the latex contain particles of the size of between about 100 and 500 nanometers. The paint includes a pH adjusting compound, preferably fugitive and typically amine based. Preferably any salt of an unsaturated fatty acid comprises at least about 50% by weight of the film forming enhancer.

The paint of the instant invention is produced by agitating the polymeric latex with the anti-foaming compound if any such anti-foaming compound is employed. Under agitation, the co-solvent is then added to the polymeric latex after the co-solvent is first diluted with a quantity of water not less than about twice nor more than about 12 times by weight the quantity of co-solvent being employed. The pH adjusting compound is then introduced under agitation until the desired pH range of between about 5 and about 11 is attained. Under agitation, the film forming enhancer is then introduced into the pH adjusted mixture but not until the film forming enhancer, particularly where salts of fatty acids, has been first diluted by a quantity of water at least about twice but not more than about 10 times the weight of the film forming enhancer.

The metallic flakes are then added and agitation is continued until the flakes are desirably entrained in the mixture. The resulting mixture including metallic flake is then filtered through a mesh. Where it is desired that a carbon or silica (colloidal) be present in the final paint, the carbon or colloidal silica may be introduced under agitation at any point during formulation of the paint.

The above and other features and advantages of the invention will become more apparent when considered in light of a detailed description of the invention that follows, forming a part of the specification.

BEST EMBODIMENT OF THE INVENTION

The present invention provides an electrically conductive, water based, air dried paint comprising metallic flake, a polymeric latex, a co-solvent, a pH adjusting compound, and a film forming enhancer.

The metallic flake typically is nickel but may be gold, silver, copper, iron phosphides such as Ferrophos® available from Occidental Chemical Corp., mixtures thereof or substrates coated therewith and is possessed of a thickness of not more than about 3 microns and a long dimension of at least about 10 microns but not greater than a dimension passable through a spray nozzle intended for applying the paint.

It should be understood that because of the extreme slender nature of such flakes, a certain amount of momentary shape distortion during passage through a nozzle under spray conditions is inherent to the flake so that a long dimension in excess of a spray nozzle opening dimension can be accommodated in the paint where the flake can bend or deform while passing through the spray nozzle. It is preferred that the flake be not more than about 1.5 microns in thickness.

In preferred embodiments the flake is nickel and is possessed of an apparent density as measured by ASTM standard B-329 of between about 0.75 and 1.50 grams/cm$_3$. Typically for such nickel flakes, a screen analysis would reveal in excess of approximately 90% of the nickel flakes being retained on a #325 U.S. Standard Screen. One particularly preferred nickel flake for use in the paint of the instant invention is a nickel flake material available from Novamet under the designations HCA-1, HCT, and HCTA.

The nickel or other flake employed in the practice of the instant invention can include metal contamination. Such metal contamination should not rise to a level whereby conductivity of the flake is impaired or to a point where corrosion products of the contaminant can cause difficulties in long term conductivity or adhesion performance of the paint.

In addition, a metallic flake such as a nickel material optionally may be coated with another conductive metal such as silver, copper, or gold in the practice of the instant invention. With gold and silver, for reasons related to cost, and, with copper, for reasons related to corrosion, it is preferred that any nickel flake be uncoated however.

The latex employed in the practice of the invention includes a reactive, styreneated, partially crosslinked polymer containing acidic functionality pendant from the backbone of the copolymer. The latex is formed of serum and copolymeric particles having an average size of between about 1000 and 5000 angstroms (100–500 nanometers) and preferably the particles range in size from about 1400 to 5000 angstroms (140–500 nanometers). The particulate copolymer is suspended within the serum in usual or conventional manner with the serum optionally including a suitable or conventional emulsifier(s), a suitable or conventional free radical initiator(s), and/or a suitable or conventional electrolyte(s) for preventing agglomeration of the copolymer particles or for imparting freeze protection to the latex. Emulsifiers, free radical initiators, or electrolytes typically comprise much less than 5% by weight of the latex. Most typically, the latex is available in a 50—50 (by weight) suspension of copolymeric particles and serum with the serum being principally comprised of water.

The copolymers hereinafter, for convenience, interchangeably referred to as polymers, characterizing the latex and finding utility in the practice of the invention are characterized by a backbone. The backbone is a co-polymer of at least two monomers selected from at least two subgroups of a group consisting of: (a) styrene; (b) acrylic esters having between about 5 and about 12 carbon atoms; (c) acrylonitrile or methacrylonitrile; (d) vinyl acetates; (e) vinyl or vinylidene chloride; (f) mono and dicarboxylic acids; (g) acrylamides; and (h) multifunctional acrylates. One of the monomers must be selected from (f), that is be a mono or dicarboxylic acid.

Styrene may be present in the polymer backbone in a weight percentage of between 0.5% and 9% and preferably not more than about 55% nor less than about 35%.

By acrylic esters what is meant is organic esters of acrylic acid or methacrylic acid of $C_4$–$C_{12}$ and preferably methyl, ethyl, n-butyl, 2-ethylhexyl esters. The acrylic esters may be present in the polymeric backbone in a quantity of between about 0 and 95% by weight but preferably not less than about 38% nor more than about 90% by weight and most preferably not more than about 50% by weight. But where the acrylic ester is an ester of methacrylic acid, the acrylic ester is preferably 0 to 15% by weight of the polymer.

Acrylonitrile or methacrylonitrile may be present in the backbone in a quantity of between 0 and 40% by weight and preferably less than 20% by weight of the polymer.

Vinyl and vinylidene chlorides, where present in the polymer backbone, typically are present in a quantity not exceeding about 90% and preferably not exceeding about 50% by weight for vinyl chloride and 20% by weight for vinylidene chloride.

By mono and dicarboxylic acids, what is meant is unsaturated carboxylic acids of $C_3$–$C_{10}$ and preferably $C_3$–$C_5$. For dicarboxylic acids, maleic, fumaric and itaconic acids are much preferred. For monocarboxylic acids, acrylic acid and methacrylic acids are preferred but crotonic, undecylenic, and sorbic acids are contemplated as within the purview of the invention. The mono and/or dicarboxylic acids are present in the backbone in a quantity of 0–20% by weight and more preferably between about 0.5 and 15% by weight of the polymer. The carboxylic acid monomer being polymerized into the backbone provides to the resulting polymer acidic functionality pendant from the polymer backbone. It is necessary that at least one mono or dicarboxylic acid be present in the backbone.

By acrylamides, what is meant is $CH_2CHCONR^1R^2$ or $CH_2C(CH_3)CONR^1R^2$ wherein $R^1$, $R^2$ may be hydrogen, and (hydroxy, methoxy, ethoxy, butoxy, and pentoxy) methyl The acrylamide is present in the polymer backbone in a quantity about 0 to 20% by weight of the polymer, preferably not more than about 15% and most preferably not more than about 5% by weight of the polymer.

By multifunctional acrylates what is meant is esters of poly-hydroxylated aliphatic compounds typified by structures such as

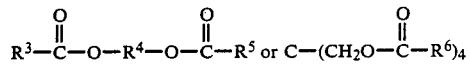

wherein $R^3$, $R^5$, $R^6$ are low molecular weight unsaturates of $C_2$–$C_6$ and preferably $C_2$–$C_3$ and $R^4$ is saturated and $C_2$–$C_{12}$. The multifunctional acrylate, if present, is present in the backbone in a quantity of not more than 5% by weight and preferably not more than about 2.5% by weight.

Polymers in latex form suitable for practicing the instant invention are available from The B.F.Goodrich Company under the commercial designations 2600×172, 2671, 2600×334, 660×13, 1800×73, 2600×315, 2600×288, 26796, 26120, 2600×337 and 2600×342 and mixtures thereof. Particularly preferred in the practice of the invention are: 2600×72; 2671; 2600×342; 2600×288; and mixtures of 2600×72 with 2600×337.

The paint of the instant invention includes a pH adjusting compound capable of adjusting an acidic pH in the paint. The acidic pH typically results from use of a latex including a polymer having pendant acidic functionality. pH adjustment should be to a value of between about 5 and about 11 and preferably between a value of about 6 and about 9. Typically amines such as ammonia and primary secondary and tertiary amines are employed in adjusting the pH of the paint. These amines typically are $C_1$–$C_5$. Other suitable or conventional pH adjusting compounds are contemplated as being within the purview of the invention.

An air drying, preferably water soluble co-solvent is included in the paint. The co-solvent customarily is possessed of a boiling point greater than water. The co-solvent is substantially capable of coalescing particles of the latex to form a coherent coating upon a surface being painted. The co-solvent should be present in the paint in a quantity preferably not greater than about 20% by weight of the polymer present in the latex (on a polymer basis) being employed and much preferably not greater than about 10% by weight of the polymer present in the latex being employed in forming the paint. The actual quantity of co-solvent employed will be, to some extent, a function of the capabilities of the co-solvent for assisting the particles in establishing a desirable film to form a coherent paint coating. Depending on the selection of a particular polymeric latex, co-solvents typically widely used in the formation of latex paints may be employed in the practice of the invention. Preferred in the practice of the instant invention are: mono-and dialkyl ethers of ethylene or propylene glycol such as butoxypropanol and propoxypropanol and derivatives thereof widely marketed and available under the trade names CELLOSOLVE ® or PROPASOL ®, their derivatives including acetates, methyl ethers and ethyl ethers; cyclohexane; elevated molecular weight alcohols such as TEXANOL ® and 4-hydroxy methyl-2 pentanone and mixtures of the foregoing. The selection of a particular cosolvent for implementing the instant invention may in part be governed by a capability for the solvent etching surfaces of plastic cabinetry to which the paint is to be applied. A co-solvent having desirable etching capability can enhance the adherence properties of the paint coating applied to the cabinetry without damaging the substrate cabinetry.

Paint adhesion is particularly a concern with plastics such as Noryl®, Lexan®, Calibre®, Styron®, Cycolac®, and Geon® and may pose problems requiring trial and error solvent selection with such polyphenylene oxides, polycarbonates, polyvinyl chlorides, ABSs and polystyrenes.

The paint of the instant invention includes a film forming enhancer, typically a salt of at least one fatty acid. Much preferably the salt includes salt of an unsaturate, the unsaturate salt being possessed of an iodine value of at least about 85 but not more than about 250. The fatty acid salt is present in the paint in a quantity of between about 1% by weight and 5% by weight of the nickel present in the paint. Typically any fatty acids in salt form are in an amine salt form.

Iodine value is a standard measure of unsaturation in a fatty acid, and a salt employed in the practice of the invention much preferably includes at least one fatty acid having unsaturation characteristics. Other fatty acids having no unsaturation may be employed in forming the salt, but unsaturated fatty acids it is believed generally should comprise at least about 15% of the salt by weight, more preferably at least about 25% by weight and most preferably about 50% of the salt by weight.

The fatty acids having desirable unsaturate properties in the practice of the invention are selected from a group consisting of: palmitoleic, oleic, linoleic, linolenic, eleostearic, ricinoleic, sterculic, arachidonic, cetoleic, erucic, nervonic, mycolipenic acids and mixtures thereof, with palmitoleic, oleic, linoleic linolenic, and mixtures thereof being preferred as more readily commercially available. It is believed that other suitable or conventional unsaturated fatty acids can be employed in the practice of the instant invention. One particular blend of fatty acids including unsaturated fatty acids and finding particular utility in the practice of the invention is Raybo 6, principally an amine salt of oleic acid, available from The Raybo Chemical Company.

Other film forming enhancers may be employed in the practice of the invention such as suitable anti- or de-foamers, but film foaming enhancers thus employed should be essentially free of silicones or silicates that can interfere with forming an integral, adhering paint film.

The paint optionally may include particulate carbon or silica (colloidal) as a hardener. With the particulate present in the paint formulation, the finished paint coating tends to be possessed of desirably harder surface characteristics. Carbon or colloidal silica may be introduced into the paint in quantities up to 10% by weight of the weight of nickel employed in the paint but it is preferred that any carbon or colloidal silica particulate introduced into the paint be limited to 5% by weight and most preferably to not more than about 1% by weight of the weight of nickel in the paint. Any suitable or conventional particulate carbon or colloidal silica material tending substantially to remain in suspension in paints formulated in accordance with the invention can be employed in the practice of the instant invention. Carbon blacks and colloidal silicas generally suitable for use in paint are well known.

Where a latex is being agitated, from time to time the inclusion of an anti-foaming agent may be required. Typically an anti-foaming agent where introduced for anti-foaming properties rather than for film forming enhancement as set forth supra should be introduced to equal not greater than about 1% and preferably about 0.1% by weight of the paint being prepared.

Any suitable or conventional anti-foaming agent can be utilized which does not substantially detract from suspension of the nickel flakes and other particulate matters within the paint. Particularly, FOAMMASTER® 111 available from Diamond Shamrock Chemicals Co. has been found to be desirably efficacious in formulation of paints according to the invention. It is believed that anti-foaming agents free of silicones or silicates perform best in the practice of the invention as silicones or silicates can substantially interfere with film forming capabilities of the paint.

Paint is made in accordance with the instant invention by first agitating the latex and introducing into the agitated latex the anti-foaming compound (where used for antifoam as opposed to film forming enhancement purposes), if any. Typically the resulting blend is then agitated for at least about one minute. The co-solvent and water are then separately blended to form a mixture wherein the co-solvent comprises not more than about one part in three by weight of the blend of co-solvent and water and not less than about one part in thirteen by weight of the blend of co-solvent and water. The blend of co-solvent and water are introduced into the mixture of latex and anti-foaming agent under agitation and blended for at least about an additional minute. The pH adjusting compound is then introduced under agitation and agitation is continued for at least about 2 minutes with the adjustment of pH to within the desired range of between 5 and about 11 and preferably between 6 and about 9 being confirmed by appropriate, well known means.

Separately, the film forming enhancer is blended with water in a ratio whereby the film forming enhancer comprises not more than one part in three of the blend of water and film forming enhancer, and not less than about one part in eleven of the blend of film forming enhancer and water. The blended film forming enhancer and water are then introduced into the pH adjusted mixture under agitation and agitation is continued for at least about 3 minutes.

The metal flake is then blended into the paint mixture under agitation and agitation is continued for at least about 10 minutes and preferably for a period of time sufficient to assure full dispersion of the metal flake within the paint blend.

Where it is desired that particulate carbon or colloidal silica be introduced into the paint blend, the carbon may be introduced after introduction of the metal flake or at any other point during processing where not detrimental to the processing or performance of the paint. Preferably, carbon or colloidal silica is introduced under agitation and agitation is continued for at least about 10 minutes to assure adequate dispersion of the particulate Finished paint is preferably filtered through a #109 U.S. Standard Sieve typically formed of nylon or cheesecloth.

The following examples further illustrate the instant invention. In the examples that follow, batches of approximately 5 gallons in volume were prepared employing a Lightnin' Mixing Equipment Co. mixer, Serial No. 3-37326.

EXAMPLE 1

12,667 grams of BFGoodrich 2600×172 latex and 37 grams of Diamond Shamrock Chemicals Co. Foammaster 111 were agitated together for one minute. 619 grams butyl Cellosolve co-solvent was blended with 2913 grams of distilled water and the resulting blend agitated into the latex and Foammaster blend for one minute. To the resulting paint, 150 grams of concentrated NH$_4$OH was added under agitation during three minutes. 338 grams of Raybo 6 was blended separately with 1674 grams of distilled water and the resulting water diluted fatty acid salt was added to the paint under agitation for five minutes. 17,595 grams of Inco Novamet HCA-1 nickel flake was added to the paint blend under agitation for fifteen minutes and 1110 grams of 15% Ketjen® black and 2.0% Raybo 6 by weight dispersed in water was then blended into the paint under agitation for 15 minutes. The resulting approximate 5.3 gallons (approximately 20 liters) of paint was filtered through a nylon #109 U.S. Standard Sieve into one gallon (approximately 3.75 liter) cans.

EXAMPLE 2

Batches of paint were made in accordance with Example 1 with latex substitutions as follows, one including BFGoodrich 2600×172 latex, one including BFGoodrich 2600×337 and one including BFGoodrich 26120 available from The BFGoodrich Company, all as shown in Table I. The film forming enhancer and associated water of dilution was omitted from the paints. The resulting paints were spray applied to achieve a 2-3 mil thickness on general purpose ABS plastic and then tested for resistivity following initial application. The spray coated ABS plastic samples were then subjected to temperature/cycling testing in accordance with UL test #746C and retested for resistivity. The initial, that is after spraying, and final, that is after spraying and temperature cycling testing, resistivity values for each of the paints is displayed in Table I with the resistivity units being Ω/square. The co-solvent employed in each of the paints formulated in accordance with Table I was butyl Cellosolve available from Union Carbide. No carbon or silica was incorporated in the paint formulations reflected in Table I.

TABLE I

| Latex | Initial Ω/square | Temperature Cycling Ω/square |
| --- | --- | --- |
| 2600 × 172 | .9 | 5.0 |
| 26120 | 0.9 | 1000 |
| 2600 × 337 | >100 | >100,000 |

EXAMPLE 3

Additional batches of the paints of Example 2 were manufactured in accordance with Example 1 employing Raybo 6 as a film forming enhancer. No carbon or silica was included in the paints. The resulting coatings were sprayed in accordance with Example 2, tested for resistivity and then subjected to temperature cycling and re-tested for resistivity in accordance with Example 2, the resistivities being displayed in Table II.

TABLE II

| Latex | Initial Ω/square | Temperature/Cycling Ω/square |
| --- | --- | --- |
| 2600 × 172 | 0.5 | 0.9 |
| 26120 | 1.1 | 150 |
| 2600 × 337 | 4.3 | 1,000 |

EXAMPLE 4

Two paint batches were made in accordance with Example 1 except omitting the carbon. The batches were sprayed on ABS general purpose plastic and an initial resistivity measurements taken. The first batch was sprayed the day after making, 5 days after making, 8 days after making, 11 days after making, 14 days after making, 28 days after making and 44 days after making. The respective resistivities in films of a sprayed 2-3 mil thickness in Ω/square were 1.1, 0.7, 0.5, 0.5, 0.5, 0.4 and 0.4. The second batch was sprayed the day after making, 2 days after making, 7 days after making, and 100 days after making. The resistivities in films of a sprayed 2-3 mil thickness in Ω/square initially for each spraying were respectively 0.8, 0.6, 0.4, and 0.3. Clearly then, before spraying, as the paint of the instant invention ages, the resistivity after spraying improves. It would appear that aging for at least a week significantly improves resistivity values, and that for aging of at least a month (about 30 days) substantial resistivity improvements can be achieved.

EXAMPLE 5

Three paint batches were made in accordance with Example 1 except using approximately 2 grams Raybo 6 blended with 15.5 grams of water, 116.1 grams of 2600×172 latex available from BFGoodrich, 0 grams of anti-foaming agent, 1.5 milliliters of aqueous 38% ammonia, 5.7 grams of butyl-Cellosolve co-solvent, and respectively 86.04 grams, 57.36 grams and 38.24 grams of mica having a nickel coating applied thereover and obtained from Kuraray (Japan) under the designation EC 325, the particles having a 30% aspect ratio at an approximate 55 micron particle size. The sample paints were all sprayed at 3-4 mil thicknesses on ABS general purpose plastic and demonstrated an initial resistivity of 0.7, 1.0, and 2.6 Ω/square respectively. After temperature/humidity aging at 70° C. and 95% relative humidity for 14 days, sprayed samples of the first two paint batches demonstrated resistivities of 1.2 and 1.6 respectively. The first of the referenced paint batches was then resprayed in a thickness of 2-3 mils and demonstrated an initial resistivity of 1.0 and a resistivity after temperature/humidity aging at 70° C and 95% relative humidity for 14 days of 5.5 Ω/square.

EXAMPLE 6.

Paint batches were made in accordance with Example 1 except that one, a control, was formulated having no film forming enhancer therein, a second batch was formulated having approximately 360 grams of Raybo-6 therein and three batches were formulated having respectively 25, 63, and 124 grams of trivalent chromium acetate therein in lieu of a fatty acid film forming enhancer. After spraying, the initial resistivities for the control, Raybo containing batch, and chromium acetate containing batches were respectively 0.9, 0.8, 0.8, 0.8, and 0.8 Ω/square. After temperature/humidity aging testing at 70° C. and 95% relative humidity for 14 days, the resistivities for sprayed samples of the batches were, for the control, Raybo, and chromium acetate batches, respectively 5.0, 2.4, 6.2, 4.2 and 2.8 /square. It is apparent then from the results of Example 6 that an agent such as chromium acetate, reactive with carboxylate functionality pendent from polymer backbone of the latex to effect cross linking of the latex polymer film employed in forming the paints of the instant invention, can assist in providing desirable enhancements to the humidity aging characteristics of the paints but fall short of temperature/humidity aging results obtained with substantially unsaturated fatty acid salts such as Raybo 6.

EXAMPLE 7

Three batches were made in accordance with Example 1 employing BFGoodrich 2600×172 latex and Raybo 6 as the film forming enhancer but including no carbon. All three batches exhibited initial resistivities of 0.7 Ω/square plus or minus 0.1 when sprayed immediately after making upon ABS general purpose plastic. The ABS sprayed samples of two of the sprayed batches were then subjected to temperature/humidity aging at 70° C. and 95% humidity for 14 days; one batch produced a resistivity after testing of 2.4 Ω/square and the other batch produced a resistivity after aging of 3.0 Ω/square.

EXAMPLE 8

Two paint batches were prepared in accordance with Example 1 employing BFGoodrich latex 2600×172 and Raybo 6 film forming enhancer but including no carbon. Each of the batches was sprayed on ABS general purpose plastic; both exhibited on ABS general purpose plastic an initial resistivity of 0.5 Ω/square. Both sprayed ABS samples were then run through temperature cycling testing in accordance with Under Writers Laboratories Test 746C; upon retest, the resulting resistivities after temperature cycling were 1.0 and 0.9 Ω/square respectively. No loss of adhesion was detected; adhesion in accordance with ASTM Standard D-3359-78 remained 5B (method B).

EXAMPLE 9

Two batches were made in accordance with Example 1 employing BFGoodrich latex 2600×172 and not including carbon. The batches immediately were sprayed onto sheets of general purpose ABS plastic sheets. For each batch one such sprayed sheet was air dried and one such sprayed sheet was oven dried. After drying, both the air dried and oven dried sheets were subjected to temperature cycling in accordance with UL std 746C and temperature/humidity testing at 70° C. and 95% relative humidity for 14 days. After temperature cycling both the oven dried and air dried samples demonstrated resistivities of approximately 0.7 Ω/square and no loss of adhesion pursuant to ASTM Std. D-3359-78(B), all were 5B. After temperature/humidity testing at 70° C. and 95% humidity for 14 days the oven dried samples demonstrated a resistivity of 2.3 and 2.5 Ω/square respectively and the air dried samples demonstrated a resistivity of 3.2 and 2.9 Ω/square respectively with, again, no loss of adhesion. Five days after the original spray application, the paints were again spray applied to sheets of ABS general purpose plastic and air dried. After temperature cycling testing the samples demonstrated a resistivity of 0.9 and 0.8 Ω/square respectively and after temperature/humidity testing the samples both demonstrated a resistivity of 1.4 Ω/square. Air drying vs oven drying does not appear to effect materially paint performance but the beneficial effect of allowing the paint to age before use was noted.

EXAMPLE 10

Four batches of paint coatings were made in accordance with Example 1 but not including film forming enhancer and carbon. The batches when spray applied to Noryl® EN 185, dried, all demonstrated an initial resistivity of 0.6 Ω/square. After temperature/humidity testing at 70° C. and 95% humidity for 14 days these sprayed batches demonstrated resistivities of 2.8, 4.8, 3.1 and 3.8 Ω/square respectively Additionally four batches were prepared in accordance with Example 1 but not including the film forming enhancer, a co-solvent and carbon. All four batches were spray applied to Noryl plastic and resulted in initial resistivities for the batches of 0 8, 0.9, 0.9, 1.0 respectively. After temperature humidity aging at 70° C. and 95% relative humidity for 14 days these films demonstrated resistivities of 2.8; 6.3; 4.2; 3.8; and 4.3 respectively Co-solvent inclusion would appear necessary therefor in promoting good film forming to provide enhanced resistivity characteristics. The batches, both including and not including co-solvent, were subjected to adhesion tests pursuant to ASTM standard D-3359-78, method B, the batches including a co-solvent achieved a 5B rating and the batches not including a co-solvent achieved a less desirable 4B rating. Co-solvent it is believed, therefore substantially improves adhesion properties.

EXAMPLE 11

Four paint batches were prepared in accordance with Example 1 not including the film forming enhancer and not including carbon. The batches were sprayed on Noryl plastic and achieved initial resistivities of 0.8, 0.8, 0.7, and 0.8 respectively. After temperature/humidity testing at 70° C. and 95% humidity for 14 days the batches achieved resistivity ratings of 5.2, 3.6, 2.8, and 4.9 Ω/square respectively. An additional four batches were made employing a doubled amount of co-solvent. These batches, when sprayed on Noryl plastic, achieved an initial resistivity of 0.7, 0.9, 0.8, and 0.8 Ω/square respectively and after temperature/humidity aging at 70° C. and 95% humidity for 14 days achieved resistivities of 2.8, 4.8, 3.1 and 3.8 Ω/square respectively. It would appear from the foregoing that where a suitable co-solvent content is included in the paint sufficient to form a coherent coating, the presence of significantly additional co-solvent does not produce markedly improved electrical properties in a resulting coating.

EXAMPLE 12

Paint was formulated in accordance with Example 1 including 1% Ketjen black by weight of the paint mixture, employing BFGoodrich 2600×172 latex and employing butyl Cellosolve and Raybo 6. Spray applications of the carbon containing paint were made to ABS general purpose plastic and initial resistivities were determined to be between 0.3 and 0.4 Ω/square for all such sprayed samples. Such sprayed samples subjected to thermal cycling pursuant to Underwriter Laboratory Procedure 746C demonstrated resistivities of between 0.8 and 0.9 after thermal cycling. Such sprayed samples subjected to temperature/humidity aging testing at 70° C. and 95% relative humidity for 14 days resulted in resistivities of between 1.0 and 1.3 Ω/square. Paint was also made in accordance with this example using such carbon which had been processed through a laboratory 3 roll mill prior to introduction into the paint. No significant resistivity differences were noted. The resistivity of ABS general purpose plastics samples initially sprayed with this milled carbon paint demonstrated resistivities of 0.3 Ω/square; after thermal cycling 0 9 Ω/square; and after humidity aging, 1.0 Ω/square.

EXAMPLE 13

Paints identical in every way to those made in Example 12 were formulated but omitting the Ketjen black. In resistivity testing on samples of ABS general purpose plastic sprayed with the resulting paints, initial resistivities were between 0.3 and 0 4 Ω/square; after thermal cycling in accordance with Underwriter Laboratories Procedure 746C, the resistivities were between 0.4 and 0.6 Ω/square; and after temperature/humidity aging at 70° C. and 95% relative humdity for 14 days the resistivities values were between 0.8 and 1.2 Ω/square. It should be noted that the resistivity values at the lower end of the range after temperature/humidity aging resulted from spray applications made approximately 3 months following formulation of the paint whereas the more elevated resistivity values after temperature/humidity aging were associated with spray tests conducted one week after formulation of the paint.

EXAMPLE 14

Paints were made in accordance with Example 1 employing butyl-Cellosolve and Raybo 6 and the latexes as set forth in Table III. No carbon black was included. Settling testing in accordance with ASTM standard D869-78 was conducted following formulation of each paint and the results are displayed in Table III. Additionally, electrically conductive commercially available oil based and latex based paints were acquired and subjected to the same settling testing after agitation sufficient to fully disperse all pigment contained therein; for comparison, the ASTM settling ratings obtained by application of standard D869-78 to these commercial paints are set forth in Table III. It would appear from Table III that the acid number of the latex, that is the number of pendant functional acid moieties per unit of polymer in the latex appears to be of some substantial significance in providing desirably slow settling characteristics to the paint. Particularly, more elevated acid numbers appear to produce more desirable settling ratings. All paints were viscosity adjusted to 300 centipoise where possible before testing.

In Table III the paint run using a non-partially cross linked latex polymer demonstrated unreasonably poorer results on settling than did the same latex polymer in a partially cross linked state indicating the great desirability for using partially cross-linked polymers.

Paint employing latex having acrylic acid present only in the serum in contrast to being present in the polymer backbone performed substantially more poorly than where acid functionality was present in the backbone of the latex polymer. Conversely, removal of acrylic acid from latex serum did not affect the settling performance of paint made with significant acid functionality pendant from the polymer backbone of the latex.

As acrylic acid has a greater tendency to induce polymer blockiness than methacrylic acid in latex formulations of the polymer, and itaconic acid an even lesser tendency, from the results in Table III it is apparent that blockiness is important to proper functioning of the paint.

The core-shell data of Table III would indicate that polymer pendant functionality adjacent the surface of the polymer particle is of substantial utility in providing desirable settling properties.

TABLE III

| Latex Copolymer[1] of | With Source Acid[2] | Latex Acid # | SETTLING RATING | | | |
|---|---|---|---|---|---|---|
| | | | 20 hrs | 44 hrs | 69 hrs | 140 hrs |
| nBa, STy, NMA, AN | AA | 26–34 | 10 | 10 | 10 | 10 |
| EtA, AN, NMA | AA | 8–10 | 8 | 6 | 5 | 4 |
| nBa, STy, NMA | AA | 17–23 | 10 | 7 | 6 | 5 |
| nBa, STy, NMA | IT | 23–29 | 9 | 8 | 7 | 5 |
| EtA, STy, NMA | MAA | 8–10 | 8 | 4 | 2 | 2 |
| EtA, STy, NMA | MAA | 7–9 | 7 | 2 | 2 | 2 |
| EtA, nBA, AN, ACN, NMA | MAA[3] | 16–20 | 10 | 10 | 10 | 10 |
| STy | MAA | 13–17 | 9 | 9 | 9 | 9 |
| nBa, STy, NMA, AN | AA[4] | 26–34 | 10 | 10 | 10 | 10 |
| nBa, STy, AN | AA[5] | 26–34 | 9 | 8 | 6 | 3 |
| Commercial Paint | | | | | | |
| Acheson Electroday 440 | | | 8 | 5 | 2 | 2 |
| Electrokinetic Systems | | | | | | |
| x-Coat 210 | | | 4 | 4 | 3 | 3 |
| x-Coat 225 | | | 7 | 3 | 3 | 3 |
| Emerson-Cumings Eccocoat CC-3W | | | 6 | 4 | 4 | 3 |

[1]nBA - n-butyl acrylate
EtA - ethyl acrylate
STy - styrene
NMA - N—methylol acrylamide
AN - acrylonitrile
ACN - acrylamide
[2]AA - acrylic acid
MAA - methacrylic acid
IT - itaconic acid
[3]Core-shell latex - methacrylic acid shell
[4]Latex slurried with Amberlite ® XAD-2 (Rohm & Haas) adsorbent for overnight and then filtered thereby removing serum polyacrylic acid that may be present.
[5]No included backbone crosslinking agent (NMA).

EXAMPLE 15

Batches of paint were made in accordance with Example 1 but employing 1% by weight of the fatty acids set forth in Table IV. Resistivites are as shown:

| Acid | Iodine Value | Initial Resistivity Ω/square | After Temperature Humidity Aging Ω/square |
|---|---|---|---|
| No fatty Acid[1] | 0 | 0.9 | 5.0 |
| Raybo 6[1] | 90 | 0.8 | 2.4 |
| Myristic[2] | 0 | 0.8 | 2.0 |
| Linoleic[2] | 181 | 0.5 | 1.9 |
| Ricinoleic[2] | 85 | 0.6 | 2.6 |

| | | After Temperature Cycling Ω/Square | |
|---|---|---|---|
| Linolenic[2] | 273.5 | 0.4 | 3.6 |
| Oleic[2] | 89.87 | 0.4 | 3.9 |
| Raybo 6[3] | 90. | 0.3 | 0.7 |

[1] Data from Example 6
[2] Triethyl ammonium salt
[3] Aged 3 months before spraying It would appear from the data that increased fatty acid unsaturation has no material effect upon maintaining desirably low resistivities after aging.

TABLE IV
CARBOSET FLAKE NICKEL FORMULATIONS

| | | RESISTIVITY Ω/SQUARE | |
|---|---|---|---|
| CARBOSET # | TYPE | INITIAL | FINAL* |
| XL-37 | HIGH CARBOXYL LESS POLAR | 2.0 | 25 |
| XL-30 | LOWER CARBOXYL | 2.5 | 30 |
| 70L-79-8 | STYRENE CONTAINING | 2.2 | 13 |

*AFTER 14 DAYS @ 70° C./95% RELATIVE HUMIDITY

EXAMPLE 16

To demonstrate the effect of lower molecular weight upon effective paint formulations, paints were made in accordance with Example 1 except utilizing the Carboset ® (BFGoodrich) resins shown in Table IV. These Carboset resins are formed of the same monomers from which preferred paints of the invention are prepared, but are possessed of a weight-average molecular weight of about 50,000 instead of the weight-average molecular weights of in excess of about 90,000 characterizing polymers employed in latexes useful in the practice of the instant invention. No carbon or colloidal silica was used. Resistivities for the resulting paints are displayed in Table IV after initial spraying and after temperature-humidity aging. From Table IV it is apparent that a latex molecular weight of in excess of about 50,000 is preferred in the practice of the invention for the polymeric latex and preferably greater than about 90,000. These paints settled very rapidly to a hardpack not withstanding a polymer acid number as great as 80 associated with the backbone of the polymer in the latex. It again appears that the distribution of acid groups and blockiness of the polymer may be important in paint performance. These properties appear to be enhanced by more elevated molecular weight polymers in the latex.

EXAMPLE 17

A paint in accordance with Example 1 was prepared employing a polymer latex identical in all respects to 2600×172 but containing no acidic functionality pendant from the backbone. The paint coagulated. Two parallel paints were then prepared containing the same polymeric latex and including 5% by weight of polyacrylic acid in the serum for the latex. One paint included 5400 molecular weight polyacrylic acid and the other 104,000 molecular weight polyacrylic acid. Both coagulated. Backbone pendant acid functionality would therefore appear essential to avoiding settling in paints including metal flakes.

EXAMPLE 18

The paint of Example 1 was applied in 3 mil coatings to Noryl ® EN215, EN185 and FN700; Lexan ® 900, FL900, and FL400; Calibre TM 70708, 700-10, and 500; Cycolac ®, KJW ; Styron 60875F; Geon ®87241, 87371 and 87302; and ABS.

General purpose substrates, adhesive testing pursuant to ASTM D-3359-78 (method B) before and after temperature cycling and temperature/humidity aging testing resulted in a 5B rating for all substrates. 5B ratings were also achieved on bonderized steel and aluminum when sprayed with the paint.

What is claimed is:

1. A method for suspending metal flakes selected from a group consisting of copper, silver, iron phosphide, gold, nickel, mixtures thereof and substrates coated therewith, to produce a metallic paint having a cured surface resistivity of less than about 10 Ω/square comprising the steps of: agitating a partially crosslinked polymer latex, the polymer having a molecular weight of at least about 90,000, a backbone, and pendant acidic function moieties therefrom in sufficient quantity to provide the polymer with an acid value of at least about 7 but not more than about 195;

adding under agitation an air drying, co-solvent having a boiling point greater than water and capable of agglomerting particles of the latex to form a coherent coating upon a surface being painted, the co-solvent being first diluted with a quantity of water at least twice and not more than twelve times the weight of co-solvent;

adding under agitation a quantity of a pH adjusting compound sufficient to adjust the pH of the resulting mixture to between about 5 and about 11.

adding under agitation film forming enhancer diluted with a quantity of water at least about twice and not more than about ten times the weight of the fatty acid;

adding under agitation a quantity of the metal flakes having a thickness of not more than aobut 3 microns and a long dimension of at least about 10 microns but not greater than passable through a spray nozzle intended for applying the paint and continuing agitation for a time period sufficient to suspend the flakes;

providing the latex on a polymer basis and the co-solvent and the film forming enhancer on an undiluted basis in a weight ratio to the metal flakes respectively of: about 15% to about 100%; about 2% to about 20%; about 1% to abotu 5%; and filtering the resulting mixture.

2. The method of claim 1 including at least one of the steps of: introducing an anti-foaming agent in a quantity of not more than about 1% by weight of the metal flakes into the agitated latex; and introducing finely divided carbon or silica (colloidal) in a quantity of not more than about 5% of the weight of the metal flakes into the paint under agitation.

3. The method of claim 2 including the step of providing in the film forming enhancer a salt icluding a fatty acid component, the salt having an iodine value of at least about 85 but not more than about 250, the fatty acid being first the unsaturate selected from a group consisting of palmitoleic, oleic, linoleic, eleostearic, sterculic, arachidonic, ricinoleic, cetroleic, erucic, nervonic, mycolipenic, linolenic acids and mixtures thereof in a proportion of at least about 25% by weight of the fatty acid.

4. The method of claim 2 including the step of providing a co-solvent selcted from a group consisting of: ester alcohols having a molecular weight exceeding about 118, elevated molecular weight alcohols, mono ethers of ethylene, propylene or methylene glycols, and acetates thereof, or methyl or ethyl esters thereof, 4-hydroxy-4 methyl-2pentanone, and mixtures thereof.

5. The method of claim 2 including the step of providing a latex selected from a group consisting of partially cross linked latexes having pendant carboxylate based moieties in having the latex particle size of between about 100 and 0500 nanometers.

6. The method of claim 2 including the step of providing a pH adjusting compound selected from a group consisting of primary tertiary and secondary aines of $C_1$-$C_5$ and ammonia.

7. The method of claims 6, the latex being a co-polymer of at least two monomers selected from a group consisting of: an unsaturated carboxylic acid containing monomer, 0.50-15% by weight; styrene 0.5-65% by weight; acrylate or methyacrylate esters, 35-90% by weight; acryloitrile or methacrylonitrile, 0-20% by weight; an acyrlamide or N-substituted acyrlamide, 0-15% by weight; and a multi-functional acrylate or methacrylate, 0-5% by weight with at least one of the monomers being mono or dicarboxylic acid.

8. The method of claim 1, including the step of aging the paint at least a week before application.

9. The method of claim 1, including the step of aging the paint at least a month before application.

10. The method of claim 7, the paint metallic being aged at least about 1 week after formation.

11. The method of claim 7, the paint metallic being aged at least about 1 month after formation.

* * * * *

UNITED STATES PATENT AND TRADEMARK OFFICE
CERTIFICATE OF CORRECTION

PATENT NO. : 4,774,270

DATED : SEPTEMBER 27, 1988

INVENTOR(S) : F. RYAN SULLIVAN AND DAVID M. ALESKA

It is certified that error appears in the above-identified patent and that said Letters Patent is hereby corrected as shown below:

| | | |
|---|---|---|
| Col. 2, line 35 | "CALIBRE®" should read --CALIBRE ™-- |
| Col. 5, line 29 | "9%" should read --99%-- |
| Col. 5, line 68 | Insert --.-- after "methyl" |
| Col. 6, line 25 | "2600x72" should read --2600x172-- |
| Col. 6, line 26 | "2600x72" should read --2600x172-- |
| Col. 6, line 35 | Insert --,-- after "primary" |
| Col. 7, line 7 | "CALIBRE®" should read -- CALIBRE ™-- |
| Col. 11, line 3 | "/square" should read --Ω/square-- |
| Col. 12, line 14 | Insert --.-- after "respectively" |
| Col. 12, line 19 | "08" should read --0.8-- |
| Col. 13, line 7 | "09" should read --0.9-- |
| Col. 13, line 15 | "04" should read --0.4-- |
| Col. 16, line 15 | "60875F" should read --6087SF-- |
| Col. 16, line 63 | "aobut" should read --about-- |
| Col. 17, line 6 | "aobut" should read --about-- |
| Col. 17, line 16 | "icluding" should read --including-- |
| Col. 17, line 21 | "cetroleic" should read --cetoleic-- |

UNITED STATES PATENT AND TRADEMARK OFFICE
CERTIFICATE OF CORRECTION

PATENT NO. : 4,774,270
DATED : September 27, 1988
INVENTOR(S) : F. Ryan Sullivan and David M. Aleska It is certified that error appears in the above-identified patent and that said Letters Patent is hereby corrected as shown below:

Col. 18, line 10   Insert --,-- after "primary"
Col. 18 line 15    "0.50" should read --0.5--

Signed and Sealed this

Twenty-fifth Day of April, 1989

Attest:

DONALD J. QUIGG

Attesting Officer

Commissioner of Patents and Trademarks